(12) United States Patent
Kiyomura

(10) Patent No.: US 7,847,328 B2
(45) Date of Patent: Dec. 7, 2010

(54) CAPACITOR ELECTRODE, METHOD FOR MANUFACTURING THE SAME, AND SEMICONDUCTOR DEVICE

(75) Inventor: Takakazu Kiyomura, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 24 days.

(21) Appl. No.: 12/392,492

(22) Filed: Feb. 25, 2009

(65) Prior Publication Data

US 2009/0225493 A1   Sep. 10, 2009

(30) Foreign Application Priority Data

Mar. 7, 2008   (JP)   ............... 2008-057719

(51) Int. Cl.
*H01L 21/02*   (2006.01)
(52) U.S. Cl. ............... 257/296; 257/532; 257/E27.016
(58) Field of Classification Search ............... 257/296, 257/532, 353; 438/608, 686
See application file for complete search history.

(56) References Cited

U.S. PATENT DOCUMENTS

2002/0151162 A1 *  10/2002  Beitel et al. ............... 438/597

2003/0047771 A1 *  3/2003  Kweon et al. ............... 257/306

OTHER PUBLICATIONS

Chu, C.M. et al., "Cylindrical Ru/SrTiO3/Ru Capacitor Technology for 0.11um Generation DRAMs," 2001 Symposium on VLSI Technology Digest of Technical Papers.
Sim, Joon Seop et al., "Characteristics of Polycrystalline SrRuO3 Thin-Film Bottom Electrodes for Metallorganic Chemical-Vapor-Deposited Pb(Zr0.2Ti0.8)O3 Thin Films," Journal of the Electrochemical Society vol. 153, No. 11 p. 777-786, 2006.

* cited by examiner

*Primary Examiner*—Phat X Cao
*Assistant Examiner*—Nga Doan
(74) *Attorney, Agent, or Firm*—McDermott Will & Emery LLP

(57) ABSTRACT

A capacitor electrode is composed of an $SrRuO_3$ film including first and second surfaces opposed to each other. The capacitor electrode contains a 10 atom % or less trivalent element in a region ranging from a position a predetermined distance away from the first surface in the thickness direction thereof up to the second surface side.

14 Claims, 10 Drawing Sheets

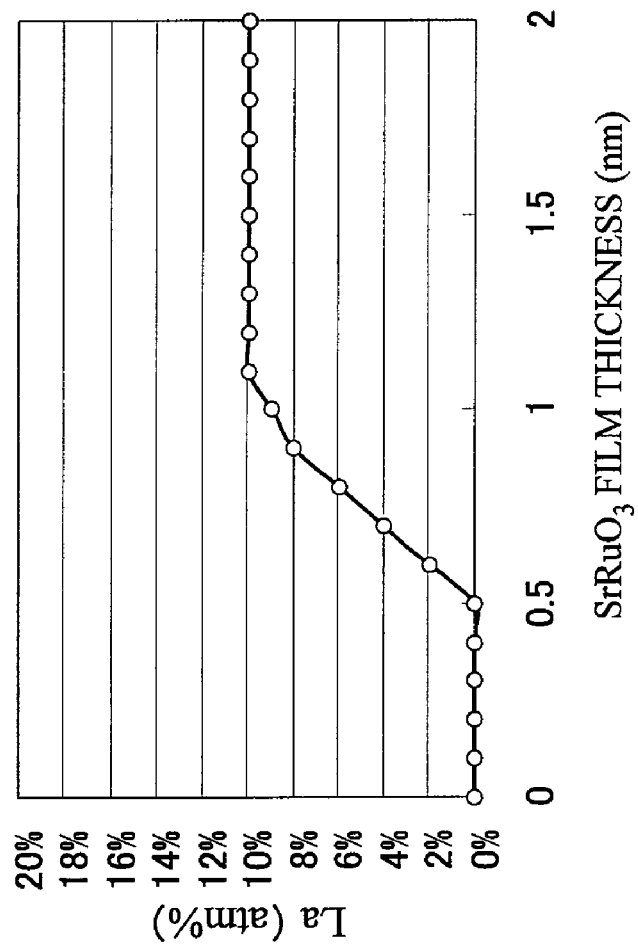
FIG. 1B
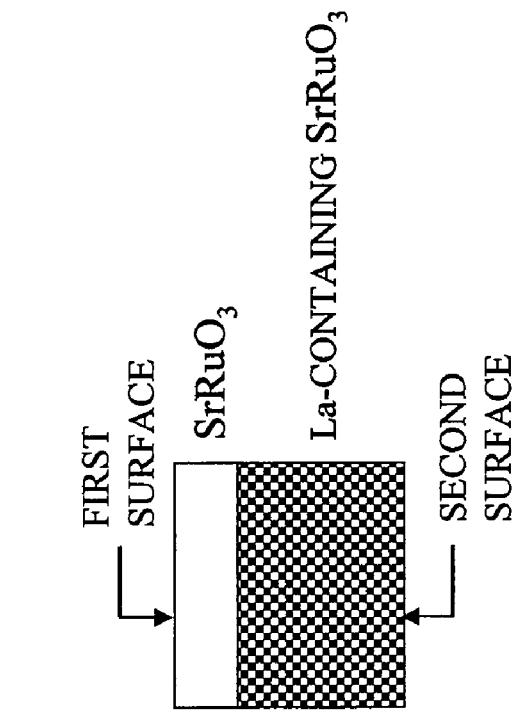
FIG. 1A
FIG. 1

ALD-(La,Sr)RuO₃ FILM FABRICATION PROCESS (1) RuOx FILM-FORMING STEP  (2) SrO FILM-FORMING STEP  (3) LaO FILM-FORMING STEP

US 7,847,328 B2

CAPACITOR ELECTRODE, METHOD FOR MANUFACTURING THE SAME, AND SEMICONDUCTOR DEVICE

This application is based upon and claims the benefit of priority from Japanese Patent Application No. 2008-057719, filed on Mar. 7, 2008, the disclosure of which is incorporated herein in its entirety by reference.

BACKGROUND OF THE INVENTION

1. Field of the Invention

The present invention relates to a capacitor electrode, a method for manufacturing the capacitor electrode, and a semiconductor device comprising a capacitor.

2. Description of the Related Art

Along with the recent progress in the miniaturization of semiconductor devices, a high-dielectric constant film has become necessary as a dielectric film for capacitors used in, for example, DRAMs of a generation in which the F value is 40 nm (40 nm-design rule generation and beyond). Hence, $SrTiO_3$ and the like have now been proposed as major candidates for that film.

A TiN/Ti electrode has been used conventionally as a capacitor electrode. Furthermore, there has been a need for an electrode having a high work function as a capacitor electrode including a high-dielectric constant film. Thus, a study has been made in recent years of electrode materials. For example, Pt can be mentioned as a material having the highest work function.

C. M. Chu, et al., Symp. On. VLSI Tech, Dig., 2001, T4B-3 discloses a capacitor comprising an $Ru/SrTiO_3/Ru$ MIM structure (Metal-Insulator-Metal structure, i.e., a capacitor structure in which upper and lower electrodes are formed of metal films) in which Ru (ruthenium) is used as an electrode material. In the capacitor described in C. M. Chu, et al., Symp. On. VLSI Tech, Dig., 2001, T4B-3, the crystal quality of a dielectric film ($SrTiO_3$) is improved by performing a heat treatment after fabricating the $Ru/SrTiO_3/Ru$ MIM structure, thereby reducing the leakage current value of the capacitor.

Joon Seop Sim et al., J. Electrochem. Soci., 153 (11) C777-C789 (2006) discloses an example in which an electrode made of an $SrRuO_3$ film containing Sr (strontium) and Ru is used as another electrode material. The crystal structure of this $SrRuO_3$ film is a perovskite structure identical to that of high-dielectric $SrTiO_3$ and the like. Use of this $SrRuO_3$ film has the advantage of being able to epitaxially grow a high-dielectric film and improve the crystal quality. Accordingly, it is possible to obtain a higher-quality film having a larger dielectric constant, compared with other electrode materials using $SrRuO_3$. In addition, since this $SrRuO_3$ has a high work function, it is a focus of attention as a promising material also for the reduction of a leakage current value.

I have now discovered that a capacitor electrode having a specific composition has a small electrical resistance value and is capable of suppressing an increase in the leakage current value in a capacitor including the capacitor electrode and a high-dielectric constant film as an insulator.

SUMMARY OF THE INVENTION

In one embodiment, there is provided a capacitor electrode comprising a first surface and a second surface opposed to each other, wherein the capacitor electrode is composed of an $SrRuO_3$ film and contains a 10 atom % or less trivalent element in a region ranging from a position a predetermined distance away from the first surface in a thickness direction thereof up to the second surface side.

In another embodiment, there is provided a capacitor electrode, comprising:

an $SrRuO_3$ film containing a 10 atom % or less trivalent element; and an $SrRuO_3$ film not containing a trivalent element.

In another embodiment, there is provided a method for manufacturing a capacitor electrode, comprising:

(a) forming an $SrRuO_3$ film containing a trivalent element having a concentration of 10 atom % or lower using an ALD method; and (b) forming an $SrRuO_3$ film not containing a trivalent element on the $SrRuO_3$ film containing the trivalent element using an ALD method.

In another embodiment, there is provided a method for manufacturing a capacitor electrode, comprising:

(1) forming an $SrRuO_3$ film containing a trivalent element having a concentration of 10 atom % or lower by repeating a series of steps (1A) to (1L) a plural number of times using an ALD method; and (2) forming an $SrRuO_3$ film not containing a trivalent element, following step (1), by repeating a series of steps (2A) to (2H) a plural number of times using an ALD method, wherein the steps (1A) to (1L) follow below:

(1A) supplying an Ru raw material gas to form an Ru film;

(1B) purging the Ru raw material gas;

(1C) performing a thermal oxidation treatment on the Ru film by supplying first gas composed of at least one of an $O_2$ gas and an $O_3$ gas;

(1D) purging the first gas;

(1E) supplying an Sr raw material gas to form an Sr film;

(1F) purging the Sr raw material gas;

(1G) performing a thermal oxidation treatment on the Sr film by supplying second gas composed of at least one of an $O_2$ gas and an $O_3$ gas;

(1H) purging the second gas;

(1I) supplying a raw material gas containing a trivalent element to form a film containing the trivalent element;

(1J) purging the raw material gas containing the trivalent element;

(1K) performing a thermal oxidation treatment on the film containing the trivalent element by supplying third gas composed of at least one of an $O_2$ gas and an $O_3$ gas; and (1 L) purging the third gas, and, wherein the steps (2A) to (2H) follow below:

(2A) supplying an Ru raw material gas to form an Ru film;

(2B) purging the Ru raw material gas;

(2C) performing a thermal oxidation treatment on the Ru film by supplying first gas composed of at least one of an $O_2$ gas and an $O_3$ gas;

(2D) purging the first gas;

(2E) supplying an Sr raw material gas to form an Sr film;

(2F) purging the Sr raw material gas;

(2G) performing a thermal oxidation treatment on the Sr film by supplying second gas composed of at least one of an $O_2$ gas and an $O_3$ gas; and (2H) purging the second gas.

BRIEF DESCRIPTION OF THE DRAWINGS

The above features and advantages of the present invention will be more apparent from the following description of certain preferred embodiments taken in conjunction with the accompanying drawings, in which:

FIG. 1 is a graphical view showing the distribution of La in a capacitor electrode of the present invention in the film thickness direction thereof;

Figure 2:
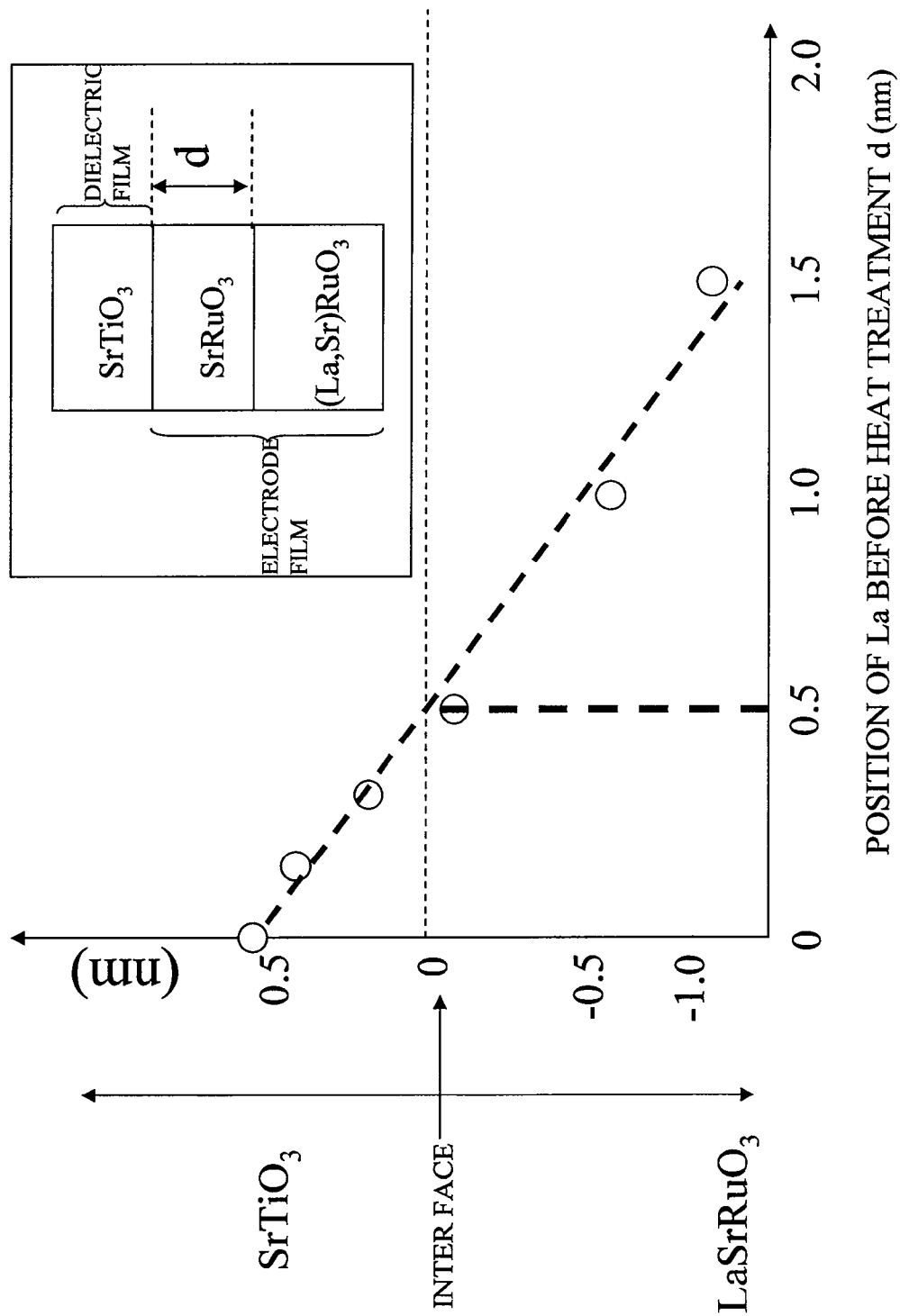
FIG. 2 is a graphical view showing a relationship between a position where La is located before heat treatment and a position where La is diffused after heat treatment in the capacitor electrode of the present invention.

In the drawings, numerals have the following meanings. 1: second surface, 2: first surface, 3: capacitor electrode, 4: dielectric film, 5: thickness direction, 6: first region, 12: word line (gate electrode), 14: bit contact plug, 15: bit line, 17: capacitor contact plug, 20: source/drain region, 21: isolating region, 22: dielectric film, 23: upper electrode, 24: lower electrode, 25: bit line, 26: capacitor contact plug, 27: interlayer insulating film, 28: gate electrode, 29: bit contact plug.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

1. Capacitor Electrode

The capacitor electrode includes a first surface contacting with on a capacitor dielectric film, and a second surface located on the other side of the capacitor electrode and opposite to the first surface. This capacitor electrode is composed of an $SrRuO_3$ (strontium-ruthenium-oxide) film. In addition, the capacitor electrode contains a 10 atom % or less trivalent element in first region ranging from a position a predetermined distance away from the first surface in the thickness direction thereof up to the second surface side.

The capacitor electrode can be made low in resistance while maintaining the work function thereof high, by containing a 10 atom % or less trivalent element in first region as described above. As a result, the capacitor electrode can have a low leakage current value and operate stably even when miniaturized. In addition, since the crystal structure of the $SrRuO_3$ film is a perovskite structure, it is easy to form an insulating film of excellent quality when a high-dielectric film also having a perovskite structure is used as a capacitor insulating film.

Figure 7:
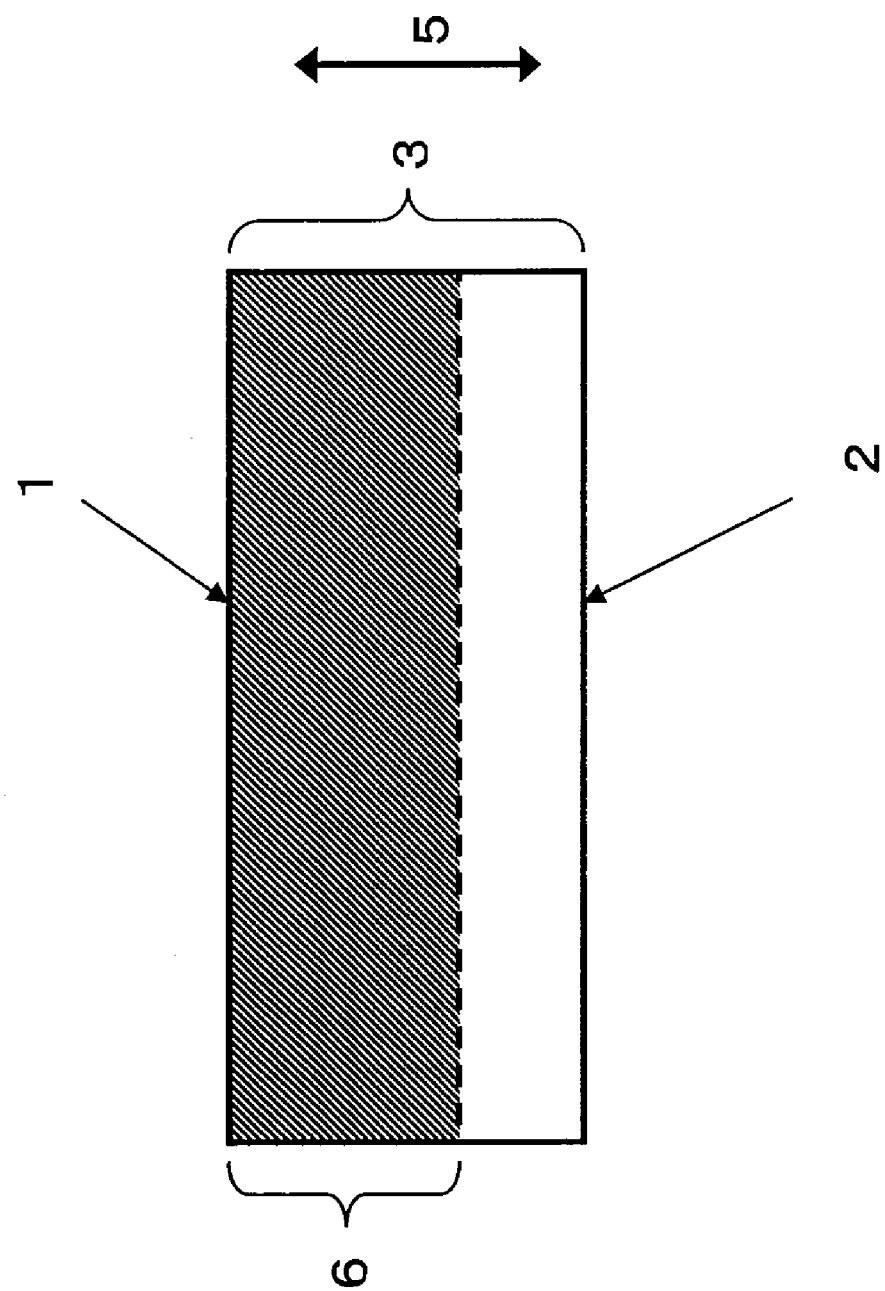
FIG. 7 is a schematic view illustrating one example of the capacitor electrode of the present invention.

FIG. 7 schematically illustrates one example of the capacitor electrode. This capacitor electrode 3 includes first surface 2 contacting with the dielectric film of a capacitor, and second surface 1 opposed to this first surface 2 and located on the other side of the capacitor electrode. The entirety of capacitor electrode 3 is composed of an $SrRuO_3$ film. In addition, the capacitor electrode contains a 10 atom % or less trivalent element in first region (shaded area 6 in FIG. 7) ranging from a position a predetermined distance away from this first surface 2 in the thickness direction thereof (direction of arrow 5 in FIG. 7) up to the second surface side.

The capacitor electrode of the present invention may be composed of a plurality of layers and the composition of each layer may be adjusted so that the capacitor electrode has such characteristics as described above. Alternatively, the capacitor electrode may be composed of a single layer including first region described above. In addition, first region may exist so as to have a predetermined film thickness when measured from a position a predetermined distance away from the first surface in the thickness direction thereof up to the second surface side. That is, first region may constitute either the whole or part of a region ranging from a position a predetermined distance away from the first surface in the thickness direction thereof up to the second surface side.

The ratio of the number of Sr atoms, Ru atoms and O atoms in "$SrRuO_3$" may not be strictly 1:1:3. Alternatively, the ratio of the number of Sr atoms, Ru atoms and O atoms may be slightly deviated from this composition.

In addition, from the viewpoint of suppressing the rise of a resistance value, a trivalent element preferably exists as uniformly as possible across the capacitor electrode in the thickness direction of first region, except first region within the film and the vicinity of an interface other than first region. Furthermore, the concentration of the trivalent element existent in first region needs to be 10 atom % or less even in a portion where the concentration is highest. The concentration of the trivalent element in first region can be measured using RBS (Rutherford Backscattering Spectrometry) by irradiating He ions to a measurement sample and detecting scattered ions with a deflection magnetic field energy analyzer.

The conductivity of the $SrRuO_3$ film can be improved by introducing a metal element higher in valence than Sr (divalent), which is a metal element in $SrRuO_3$, and controlling electron production within the film. A trivalent element higher in valence than Sr (divalent) is contained in the capacitor electrode at an appropriate concentration to substitute the Sr sites of $SrRuO_3$ with the trivalent element and thereby produce electrons. Thus, it is possible to reduce the resistance of the $SrRuO_3$ film. Since whether or not this electron production takes place depends on the valence of an element to be added, the type of the trivalent element is not limited in particular. As this trivalent element, it is possible to use at least one type of element selected from the group consisting of, for example, B (boron), Al (aluminum), Ga (gallium), In (indium), Tl (thallium) and La (lanthanum). La, among other trivalent elements, has a high level of exchangeability with Sr sites and that it is easy to contain La of a desired concentration in a capacitor electrode. It is therefore preferable to select La.

FIG. 1 shows one example of the composition distribution of La in the thickness direction of a 2 nm-thick capacitor electrode using La (lanthanum) as a trivalent element. FIG. 1A is a cross-sectional view of the capacitor electrode, whereas FIG. 1B is a graphical view showing the La concentration distribution of the capacitor electrode in the film thickness direction thereof.

In FIG. 1B, the position in which the film thickness is 0 nm represents a first surface where the capacitor electrode contacts with the dielectric film, and the position in which the film thickness is 2 nm represents the second surface of the capacitor electrode. From FIG. 1, it is understood that in this capacitor electrode, La does not exist in a position where the film thickness is less than 0 to 0.5 nm but exists only in a position where the film thickness is 0.5 to 2 nm. It is also understood that the La concentration gradually increases in a region where the film thickness is approximately 0.5 to 1 nm and is at an almost constant level of approximately 10 atom % in the vicinity of the second surface.

Hereinafter, an explanation will be made of the advantage of La being existent at a concentration of 10 atom % in first region ranging from a position 0.5 nm away from the first surface up to the second surface side, as one example in which La is used as a trivalent element and first region is a predetermined distance away from the first surface in the thickness direction thereof.

FIG. 2 is a graphical view showing the presence or absence of the diffusion of La (trivalent element) in a capacitor electrode into a dielectric film ($SrTiO_3$) composing a capacitor when a heat treatment is performed at 600° C. for 10 minutes. The horizontal axis in FIG. 2 represents a position where La begins to exist over a range from the first surface of the capacitor electrode before heat treatment toward the thickness direction thereof, wherein the 0 nm position represents the first surface.

The vertical axis in FIG. 2 represents a position within the dielectric film where La has diffused after heat treatment, wherein the 0 nm position represents an interface between the first surface and the dielectric film of the capacitor electrode. In addition, a position with a negative value on the vertical axis represents that La exists in the capacitor electrode and a position with a positive value represents that La exists in the dielectric film.

From FIG. 2, it is understood that if the horizontal-axis value is less than 0.5 nm (the position, where La exists over a range from the first surface of the capacitor electrode toward the thickness thereof before heat treatment, is less than 0.5 nm), then La is located where the vertical axis has positive values. That is, La diffuses into the dielectric film after heat treatment, in this case. If La (trivalent element) diffuses into the dielectric film in this way at the time of heat treatment, the leakage current increases to a large value. The reason for this is considered to be that as a result of the Sr sites of $SrTiO_3$ being substituted with La, a level of La is established at a level deeper than the level of the conduction band of the dielectric film. This level comes into existence as a trap level and, therefore, a leakage current value calculated from the Schottky formula becomes large.

In contrast, if the horizontal-axis value is 0.5 nm or greater (the position, where La exists over a range from the first surface of the capacitor electrode toward the thickness direction thereof before heat treatment, is 0.5 nm or greater), then La is located where the vertical axis has negative values. That is, La does not diffuse into the dielectric film even if a heat treatment is performed. Accordingly, it is understood that La, if caused to exist in a region 0.5 nm or more away from the first surface of the capacitor electrode in the thickness direction thereof, does not diffuse into the dielectric film even by heat treatment and therefore, it is possible to reduce the leakage current value.

Although in FIG. 2, an example has been shown in which La located less than 0.5 nm away from the first surface diffuses into the dielectric film, the diffusion distance of La is affected by heat treatment conditions (temperature, time and the like). Accordingly, distance setting may be performed so as to locate first region, in which La exists, distant from the first surface of the capacitor electrode according to heat treatment conditions to be used, so that La does not diffuse into the dielectric film. That is, the capacitor electrode includes a region, in which La does not exist, in the vicinity of the first surface that finally contacts with the dielectric film.

Also although in FIG. 2, an example has been shown in which La is used as a trivalent element, an increase in the leakage current value is caused even when another trivalent element is used, if the trivalent element is diffused into the dielectric film by heat treatment. Accordingly, by containing a trivalent element only in first region located a predetermined distance away from the first surface of the capacitor electrode, it is possible to reduce the leakage current value.

An explanation will be made of effect on resistance value as a result of trivalent element being existent in a position away from first surface in the thickness direction thereof.

Figure 3:
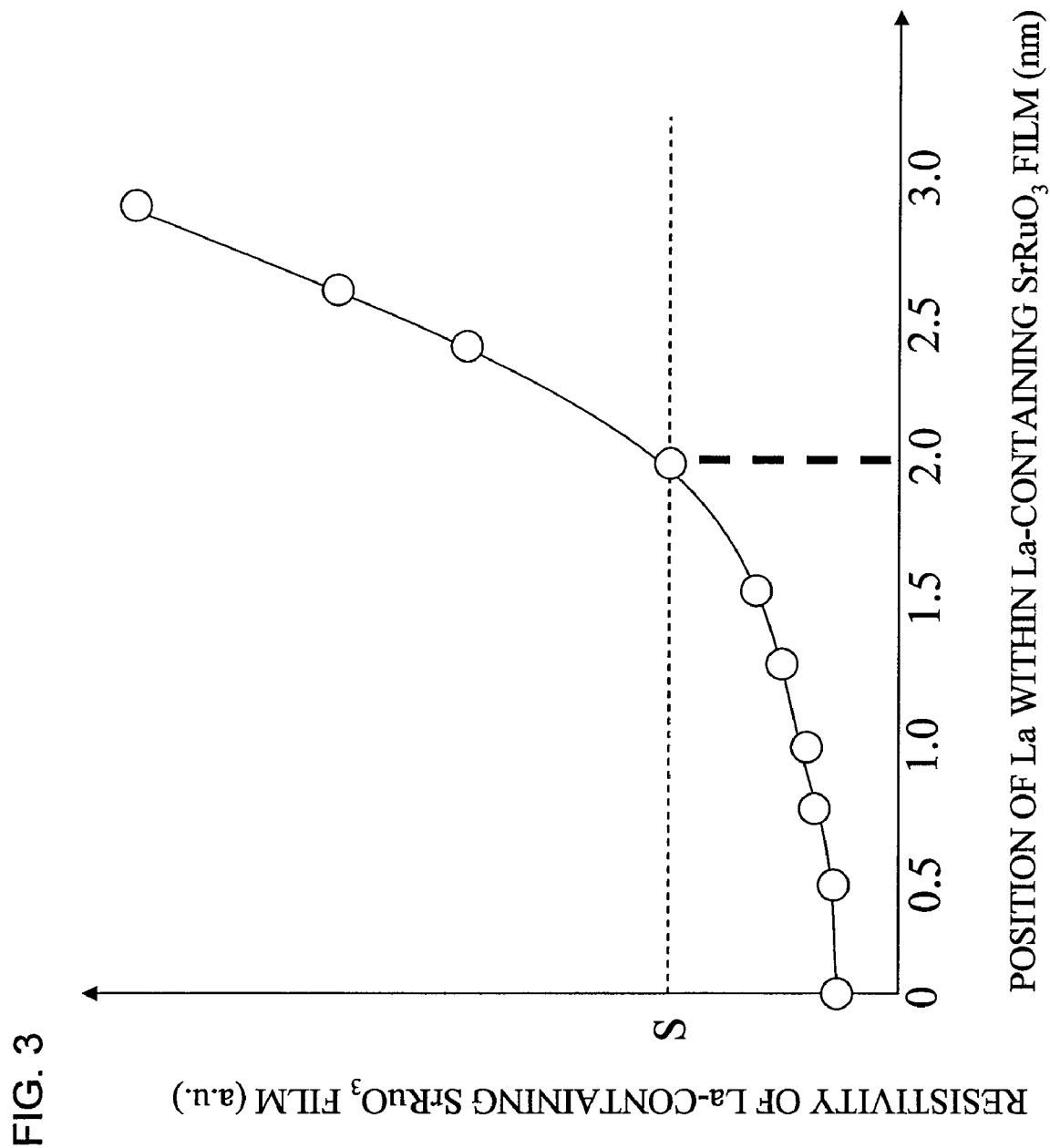
FIG. 3 is a graphical view showing a relationship between a position where La is located in the capacitor electrode of the present invention and the surface resistance value thereof.

FIG. 3 is a graphical view representing the effect of the position of La (trivalent element) on the resistivity of an $SrRuO_3$ film having the same thickness. The horizontal axis in FIG. 3 represents a position where La begins to exist over a range from the first surface of the capacitor electrode toward the thickness direction thereof, wherein the 0 nm position represents the first surface. The vertical axis in FIG. 3 represents the resistivity of a capacitor electrode film. The resistivity is measured using a four-terminal method which is a publicly-known means. Values on the vertical axis are shown after being standardized with resistivity at the 0 nm position on the horizontal axis.

From FIG. 3, it is understood that as the value of the horizontal axis increases, i.e., as the distance of a position, where La begins to exist, from the first surface of the capacitor electrode in the thickness direction thereof increases, the resistivity of the capacitor electrode increases. The reason for this is that the conductive property of the $SrRuO_3$ film as a whole degrades as the volume of an La-containing region decreases. In FIG. 3, resistivity value S shown by a dotted line on the vertical axis denotes resistivity desired for a capacitor electrode used as a memory cell of a DRAM or the like. In this case, it is understood that the surface resistance value of the capacitor electrode increases beyond the value required of a practical device, if the value of the horizontal axis exceeds 2 nm. In contrast, it is understood that the surface resistance value of the capacitor electrode falls within a range required of a practical device, if the value of the horizontal axis is 2 nm or smaller.

In FIG. 3, the setpoint of characteristic value S can be changed according to performance required of a device to be used. Consequently, it is possible to determine a starting position to begin introducing La, according to a resistance value required for the capacitor electrode. Therefore, a position optimum as the starting position of La introduction may be selected in conjunction with the earlier-described viewpoint of leakage current values.

Also although in FIG. 3, an example has been shown in which La is used as a trivalent element, the resistance value also increases as the starting position of a region, where the trivalent element is introduced, lies farther from the first surface of the capacitor electrode, even when another trivalent element is used. Consequently, the starting position of the region where the trivalent element is introduced may be determined according to a resistance value required for the capacitor electrode.

An explanation will be made of advantage of the concentration of trivalent element in first region being 10 atom % or lower.

Figure 4:
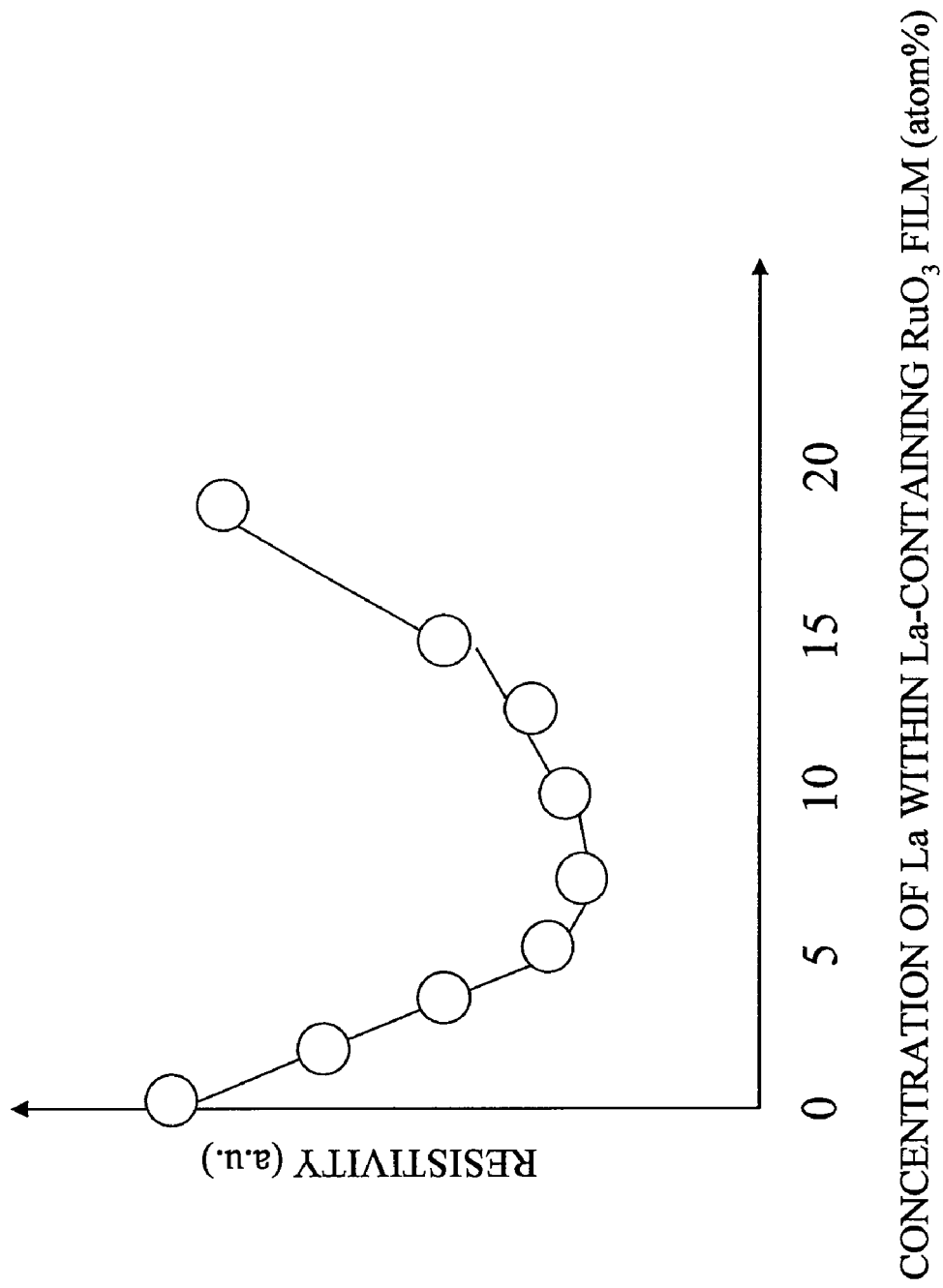
FIG. 4 is a schematic view showing a relationship between the resistivity and the La concentration of the capacitor electrode of the present invention.

If the concentration of a trivalent element added into first region is excessively high, the conductive property of the $SrRuO_3$ film is impaired to the contrary. FIG. 4 is a graphical view showing the effect of the concentration of La (trivalent element) within the capacitor electrode on the resistivity thereof. The horizontal axis in FIG. 4 represents the maximum concentration of La within the capacitor electrode, whereas the vertical axis represents the resistivity of the capacitor electrode. From FIG. 4, it is understood that the capacitor electrode shows a low resistance value when the concentration of La within the capacitor electrode is approximately 5 to 10 atom %. On the other hand, the resistivity goes up when the La concentration exceeds 10%.

Although in FIG. 4, an example has been shown in which La is used as a trivalent element, the resistivity also goes up even when another trivalent element is used, if the amount of the trivalent element introduced increases. Accordingly, it is possible to reduce the resistivity of the capacitor electrode by containing a trivalent element in first region at a concentration of 10 atom % or lower. The lower limit of the concentration of the trivalent element to be added may be determined according to the desired resistance value of the capacitor electrode.

2. Method for Manufacturing Capacitor Electrode

One example of a method for manufacturing a capacitor electrode comprises:

(1) forming first region by repeating a series of steps (1A) to (1L) a plural number of times using an ALD (Atomic Layer Deposition) method; and (1A) supplying an Ru raw material gas to form an Ru film;

(1B) purging the Ru raw material gas;

(1C) performing a thermal oxidation treatment on the Ru film by supplying first gas composed of at least one of an $O_2$ first gasnd an $O_3$ gas;

(1D) purging the first gas;

(1E) supplying an Sr raw material gas to form an Sr film;

(1F) purging the Sr raw material gas;

(1G) performing a thermal oxidation treatment on the Sr film by supplying second gas composed of at least one of an $O_2$ gas and an $O_3$ gas;

(1H) purging the second gas;

(1I) supplying a raw material gas containing the trivalent element to form a film containing a trivalent element;

(1J) purging the raw material gas containing the trivalent element;

(1K) performing a thermal oxidation treatment on the film containing the trivalent element by supplying third gas composed of at least one of an $O_2$ gas and an $O_3$ gas; and (1L) purging the third gas, (2) forming an $SrRuO_3$ film not containing a trivalent element, following step (1), by repeating a series of steps (2A) to (2H) a plural number of times using an ALD (Atomic Layer Deposition) method (2A) supplying an Ru raw material gas to form an Ru film;

(2B) purging the Ru raw material gas;

(2C) performing a thermal oxidation treatment on the Ru film by supplying first gas composed of at least one of an $O_2$ first gasnd an $O_3$ gas;

(2D) purging the first gas;

(2E) supplying an Sr raw material gas to form an Sr film;

(2F) purging the Sr raw material gas;

(2G) performing a thermal oxidation treatment on the Sr film by supplying second gas composed of at least one of an $O_2$ gas and an $O_3$ gas; and (2H) purging the second gas.

Figure 6:
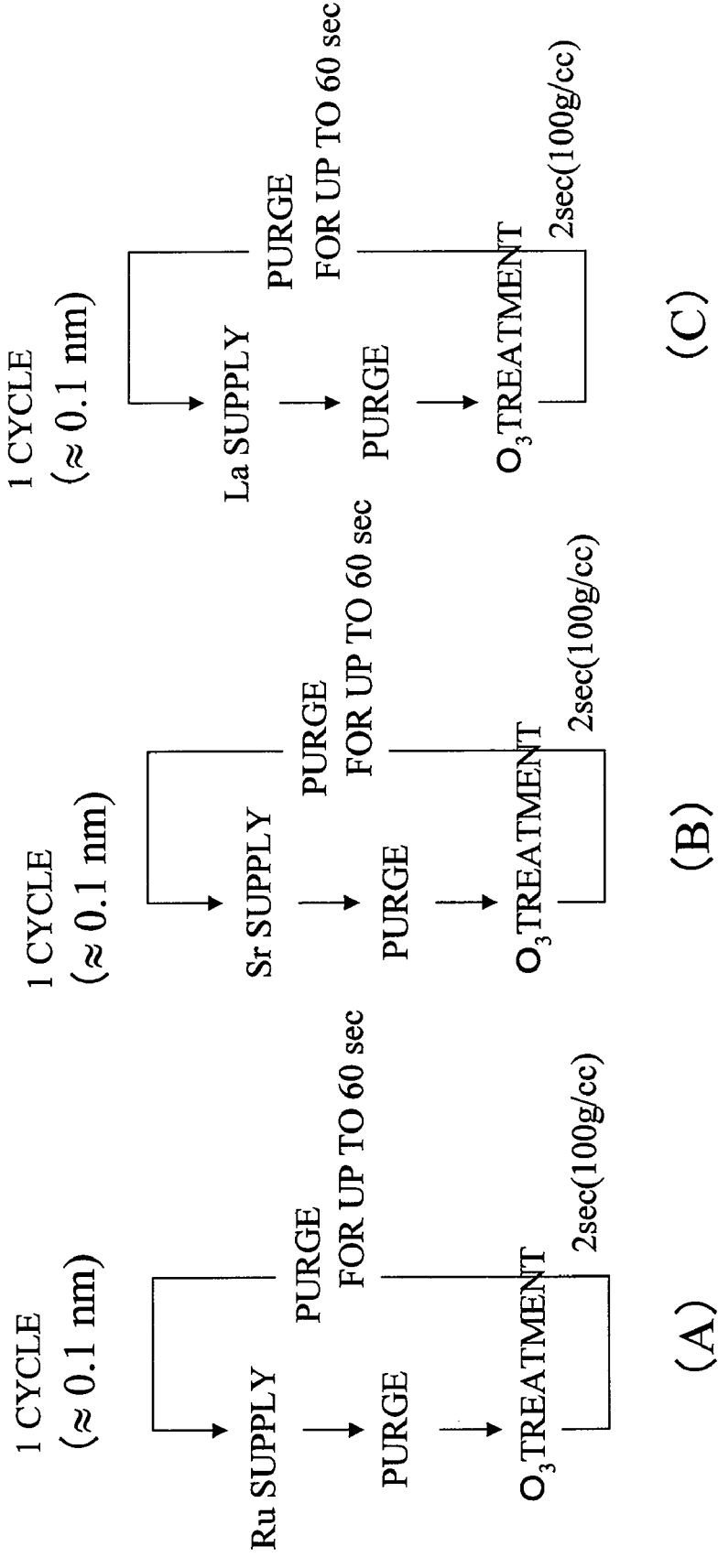
FIG. 6 is a schematic view illustrating one example of a manufacturing process of the capacitor electrode of the present invention.

FIG. 6 schematically illustrates a case in which La is used as a trivalent element, as one example of a manufacturing method.

As shown in FIG. 6A, in the manufacturing method, an $RuO_x$ film is formed by carrying out steps (1A) to (1D) or (2A) to (2D) as one cycle. Likewise, as shown in FIG. 6B, an SrO film is formed by carrying out steps (1E) to (1H) or (2E) to (2H) as one cycle. In addition, the thermal diffusion of the SrO film formed on the $RuO_x$ film is caused by carrying out steps (E) to (H), following steps (A) to (D), and thereby an $SrRuO_3$ film is formed. Furthermore, as shown in FIG. 6C, an LaO film is formed by carrying out steps (1I) to (1L) as one cycle. In addition, the thermal diffusion of the LaO film formed on the $SrRuO_3$ film is caused by carrying out steps (1I) to (1L), following steps (1A) to (1H), and thereby an $SrRuO_3$ film containing La is formed.

Accordingly, in step (1) described above, it is possible to form an $SrRuO_3$ film having a desired thickness and containing La by carrying out the series of steps (1A) to (1L) a plural number of times using an ALD (Atomic Layer Deposition) method.

Furthermore, in step (2) described above, it is possible to form an $SrRuO_3$ film having a desired thickness and not containing La on the La-containing $SrRuO_3$ film by carrying out the series of steps (2A) to (2H) a plural number of times using an ALD (Atomic Layer Deposition) method.

If the position where La begins to exist needs to be located, for example, 0.5 nm away from the first surface of the $SrRuO_3$ film, a 0.5 nm-thick $SrRuO_3$ film not containing La may be deposited on the La-containing $SrRuO_3$ film by adjusting the frequency of carrying out the series of steps in step (2).

The "ALD (Atomic Layer Deposition) method" refers to a method in which the supply of a raw material gas and film-forming, the purge of the raw material gas, the supply and reaction of a reactant gas, and the purge of the reactant gas are performed as one cycle, thereby forming a single-atom or single-molecule layer for each cycle.

As the Ru raw material gas, it is possible to use at least one type of gas selected from the group consisting of the following gases:

2,4-(dimethylpentadienyl)(ethylcyclopentadienyl)Ru;

$Ru(C_7H_{11})(C_7H_9)$;

$Ru(C_1H_{19}O_2)_3[Ru(thd)_3]$;

$Ru(C_5H_5)_2[Ru(CP)_2]$;

$Ru(C_2H_5C_5H_4)_2[Ru(EtCp)_2]$; and $Ru_3(CO)_{12}$.

As the Sr raw material gas, it is possible to use at least one type of gas selected from the group consisting of the following gases:

Sr(METHD)$_2$;

Sr(C$_5$iPr$_3$H$_2$)$_2$;

Sr(CP*)$_2$(DEM:bis(pentamethylcyclopentadienyl) strontium); and 1,2-dimethoxythane adduct.

As a raw material gas when La is used as a trivalent element, it is possible to use at least one type of gas selected from the group consisting of the following gases:

La(THD)$_3$ tris(2,2,6,6-tetramethyl-3,5-heptadionato)-lanthanum);

La(iPrCp)$_3$ tris(iso-propylcyclopentadienyl)-lanthanum;

La(sBuCp)$_3$ tris(sec-butylcyclopentadienyl)-lanthanum; and

La(EDMDD)$_3$ tris(6-ethyl-2,2-dimethyl-3,5-decanedionato)-lanthanum.

First Exemplary Embodiment

Hereinafter, an explanation will be made of a specific manufacturing method when La is used as a trivalent element.

Step (1) includes:

(1A) supplying an Ru raw material gas for a period of time from less than 20 ms to 1 s on a substrate heated to a temperature of 300° C. to form an Ru film;

(1B) purging the Ru raw material gas;

(1C) performing a thermal oxidation treatment on the Ru film by supplying first gas containing 100 g of O$_2$ or O$_3$ per 1 cc for 2 seconds, while maintaining the temperature at 300° C.;

(1D) purging the first gas;

(1E) supplying an Sr raw material gas for a period of time from less than 20 ms to 1 s to form an Sr film, while maintaining the temperature at 300° C.;

(1F) purging the Sr raw material gas;

(1G) performing a thermal oxidation treatment on the Sr film by supplying second gas containing 100 g of O$_2$ or O$_3$ per 1 cc for 2 seconds, while maintaining the temperature at 300° C.;

(1H) purging the second gas;

(1I) supplying an La raw material gas for a period of time from less than 20 ms to 1 s to form an La film, while maintaining the temperature at 300° C.;

(1J) purging the La raw material gas;

(1K) performing a thermal oxidation treatment on the La film by supplying third gas containing 100 g of O$_2$ or O$_3$ per 1 cc for 2 seconds, while maintaining the temperature at 300° C.; and (1L) purging the third gas.

In each of step groups (1A) to (1D), (1E) to (1H), and (1I) to (1L) described above, an approximately 0.1 nm-thick film is formed. By continuously and repetitively carrying out steps (1A) to (1L) described above, an approximately 8 nm-thick La-containing SrRuO$_3$ film (first region) is formed.

Step (2) includes:

(2A) supplying an Ru raw material gas for a period of time from less than 20 ms to 1 s on a substrate heated to a temperature of 300° C. to form an Ru film;

(2B) purging the Ru raw material gas;

(2C) performing a thermal oxidation treatment on the Ru film by supplying first gas containing 100 g of O$_2$ or O$_3$ per 1 cc for 2 seconds, while maintaining the temperature at 300° C.;

(2D) purging the first gas;

(2E) supplying an Sr raw material gas for a period of time from less than 20 ms to 1 s to form an Sr film, while maintaining the temperature at 300° C.;

(2F) purging the Sr raw material gas;

(2G) performing a thermal oxidation treatment on the Sr film by supplying second gas containing 100 g of O$_2$ or O$_3$ per 1 cc for 2 seconds, while maintaining the temperature at 300° C.; and (2H) purging the second gas.

In each of step groups (2A) to (2D) and (2E) to (2H) described above, an approximately 0.1 nm-thick film is formed. By continuously and repetitively carrying out steps (2A) to (2H) described above, an SrRuO$_3$ film having an approximately 2 nm thickness and not containing La is formed on the SrRuO$_3$ film formed in step (1). By carrying out step (2) flowing step (1), there is obtained an approximately 10 nm-thick SrRuO$_3$ film. The SrRuO$_3$ film is such that La is not contained in a distance range approximately 2 nm away from the upper surface (first surface) of this film in the thickness direction thereof, whereas La is contained in a distance range of approximately 2 to 10 nm from the upper surface (first surface) in the thickness direction thereof.

3. Capacitor

A capacitor includes two capacitor electrodes and a dielectric film formed between these two capacitor electrodes so as to contact with the first surfaces of the two capacitor electrodes. That is, the capacitor includes a first capacitor electrode, a dielectric film formed so as to contact with the first surface of the first capacitor electrode, and a second capacitor electrode formed on the dielectric film so that the first surface thereof contacts with on the dielectric film, in this order.

Figure 8:
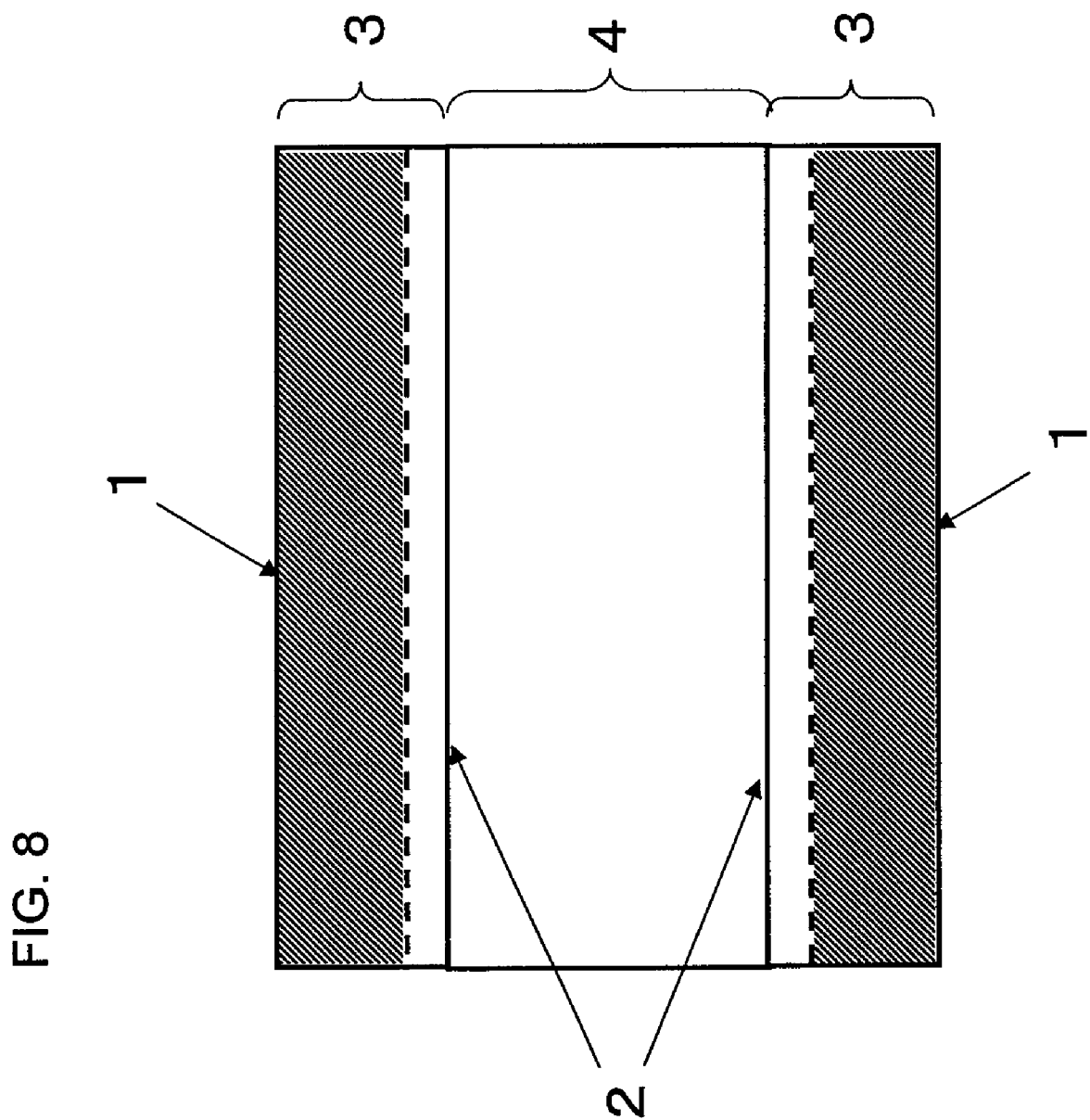
FIG. 8 is a schematic view illustrating part of the capacitor of the present invention.

FIG. 8 schematically illustrates the capacitor of the present invention. This capacitor is formed with two capacitor electrodes 3 and dielectric film 4 between these two capacitor electrodes 3. Each capacitor electrode 3 is arranged so that first surface 2 thereof contacts with dielectric film 4.

Figure 5:
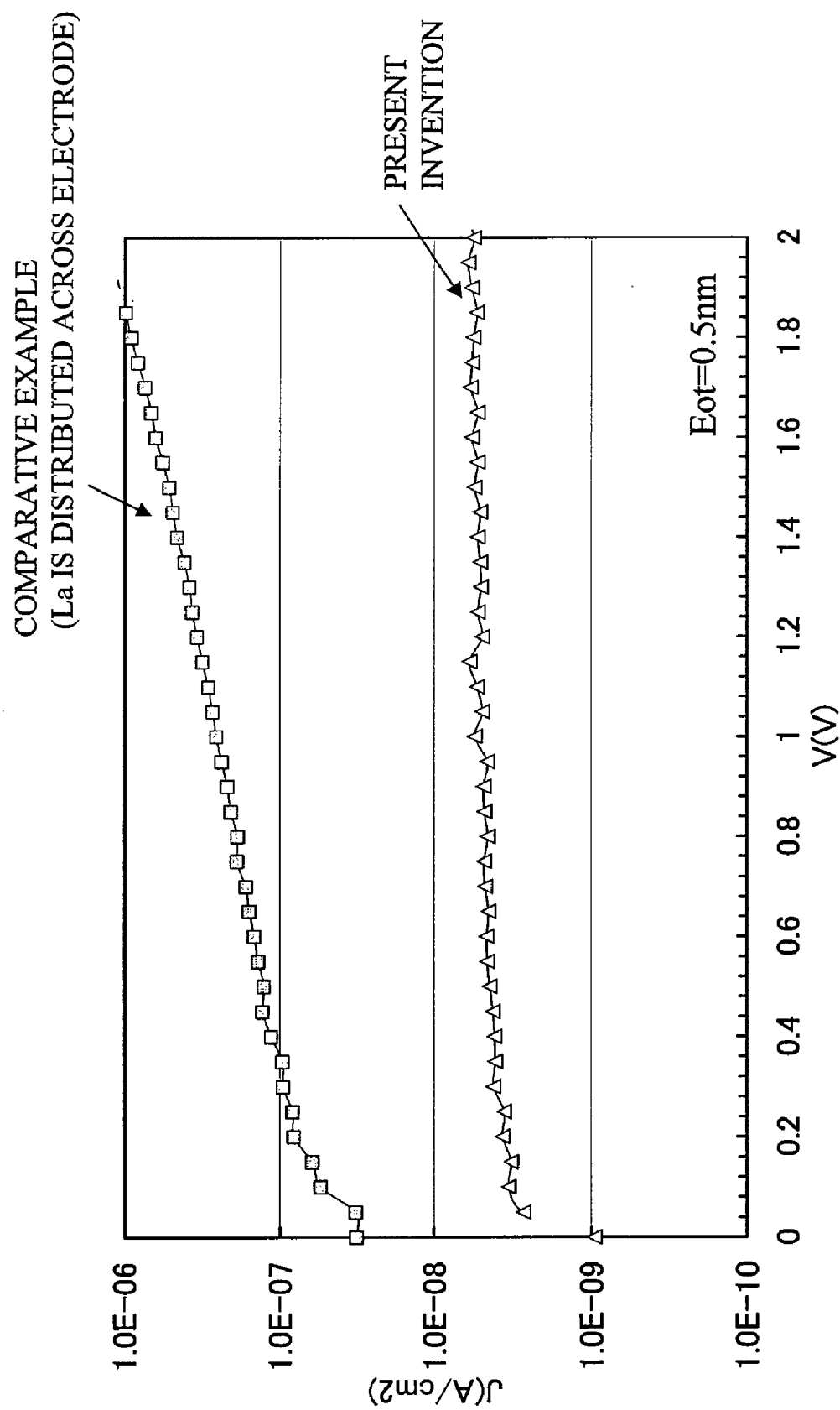
FIG. 5 is a graphical view showing the electrical characteristics of capacitors of the present invention and a comparative example.

FIG. 5 is a graphical view showing the result of measuring the leakage current values of capacitors of the present invention and a comparative example. The horizontal axis represents an applied voltage, whereas the vertical axis represents a leakage current value per unit area. A capacitor electrode of the capacitor of the comparative example contains La across the entire thickness thereof. Also an SrTiO$_3$ film is used as the dielectric film. From FIG. 5, it is understood that in the capacitor of the present invention, the leakage current is controlled to a value as small as $1 \times 10^{-8}$ A/cm$^2$ or less, whereas the leakage current of the capacitor of the comparative example is as large as more than $1 \times 10^{-8}$ A/cm$^2$.

Table 1 shows the result of measuring the work function and resistivity of each capacitor electrode and the leakage current value of each capacitor with regard to the capacitor of the present invention, a capacitor (comparative example 1) not containing La in the capacitor electrodes thereof, and a capacitor (comparative example 2) containing La in the capacitor electrodes thereof across the entire thickness thereof. An SrTiO$_3$ film is used as the dielectric film. The capacitor electrode of the present invention includes 2 nm-thick SrRuO$_3$ film not containing La on an La-containing SrRuO$_3$ film (first region). In addition, the concentration of La is controlled to 10 atom % or lower.

TABLE 1

CHARACTERISTICS COMPARISON BETWEEN PRESENT INVENTION AND COMPARATIVE EXAMPLES

|  | UPPER ELECTRODE | DIELECTRIC MATERIAL | LOWER ELECTRODE | WORK FUNCTION (eV) | RESISTIVITY ($\Omega \cdot cm$) | LEAKAGE CURRENT VALUE ($A/cm^2$)/1 V |
|---|---|---|---|---|---|---|
| PRESENT INVENTION | $(La,Sr)RuO_3$ La CONTAINED ONLY IN FIRST REGION | $SrTiO_3$ | $(La,Sr)RuO_3$ La CONTAINED ONLY IN FIRST REGION | 5.3 | 6e−5 | 7e−9 |
| COMPARATIVE EXAMPLE 2 | $(La,Sr)RuO_3$ La CONTAINED IN WHOLE | $SrTiO_3$ | $(La,Sr)RuO_3$ La CONTAINED IN WHOLE | 5.1 | 5e−5 | 2e−7 |
| COMPARATIVE EXAMPLE 1 | $SrRuO_3$ | $SrTiO_3$ | $SrRuO_3$ | 5.2 | 5e−4 | 2e−8 |

As shown in Table 1, it is understood that the work function of the capacitor electrode of the present invention is as large as 5.3 eV and the resistivity thereof is as low as $6 \times 10^{-5}$ $\Omega \cdot cm$. It is also understood that the leakage current value of the capacitor of the present invention is as low as $7 \times 10^{-9}$ $A/cm^2$ at 1 V.

In contrast, it is understood that although the resistivity of the capacitor electrode of comparative example 2 is almost the same as that of the capacitor electrode of the present invention, the leakage current value comparative example 2 is as large as $2 \times 10^{-7}$ $A/cm^2$. This is due to the effect of La having diffused into the dielectric film ($SrTiO_3$) caused because the capacitor electrode contains La across the entire thickness thereof.

In addition, the resistivity of the capacitor electrode of comparative example 1 is $5 \times 10^{-4}$ $\Omega \cdot cm$, which is larger than that of the capacitor electrode of the present invention. This means that the capacitor electrode of comparative example 1 is inferior in conductivity because the capacitor electrode does not contain La.

As has been described heretofore, even in a case where such a high-dielectric constant film having a relative permittivity of 40 or greater as an $SrTiO_3$ film is used, it is possible to form a capacitor adaptable to miniaturization and having a suppressed leakage current value while being low in resistance, by combining the $SrTiO_3$ film with the capacitor electrode of the present invention. The type of dielectric film is not limited in particular but preferably contains at least one type of oxide selected from the group consisting of $SrTiO_3$, $TiO_2$, $La_2O_3$, $Y_2O_3$, $HfO_2$, $ZrO_2$ and $(Ba,Sr)TiO_3$. In addition, using a high-dielectric dielectric film preferably composed of $SrTiO_3$, among these oxides, it is possible to easily form a high-performance capacitor.

Furthermore, it is possible to easily form a memory cell for a high-performance DRAM by connecting a capacitor formed using the present invention and a MOS-type transistor to each other by publicly-known means.

Figure 9:
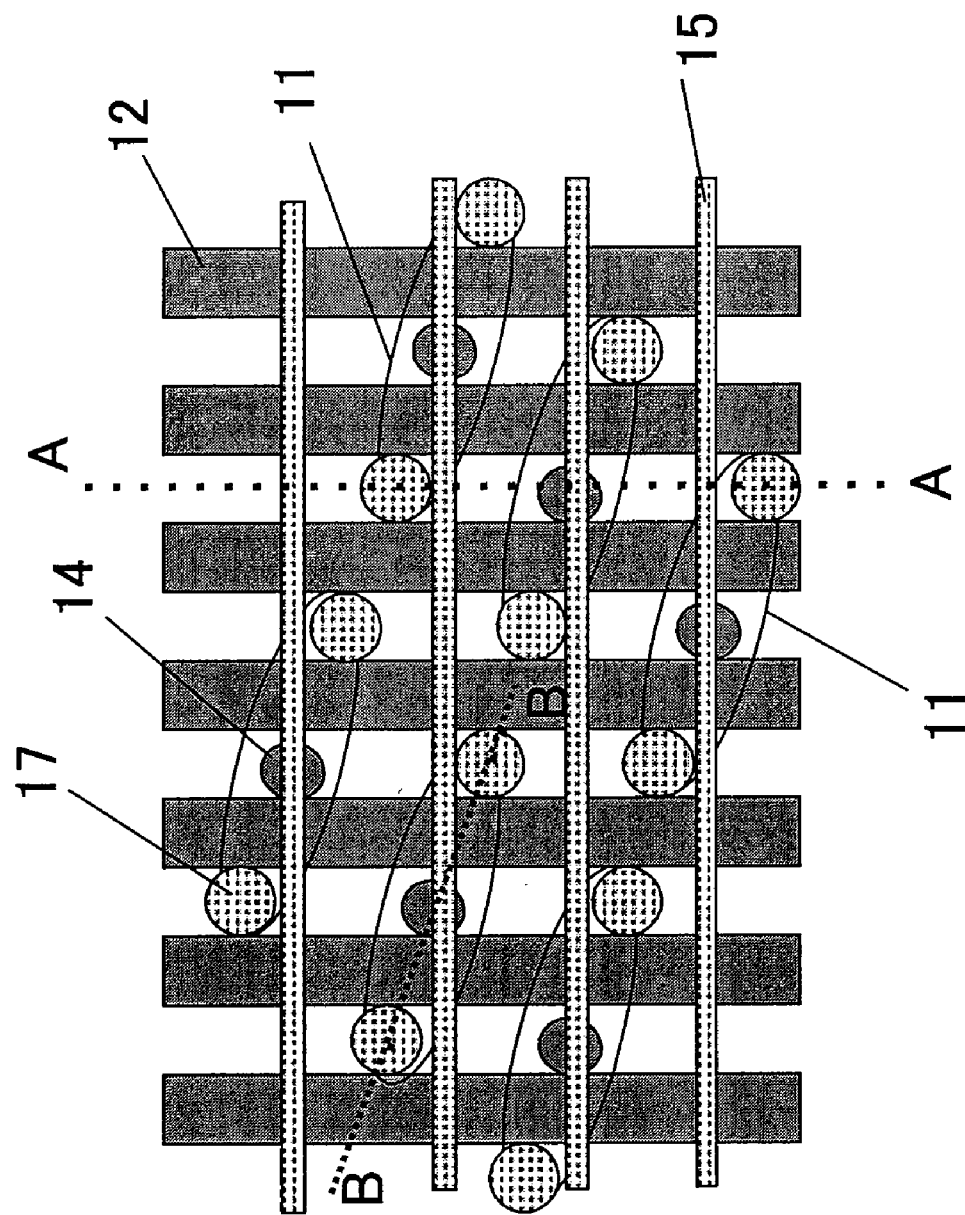
FIG. 9 is a schematic view illustrating part of a DRAM including the capacitor of the present invention.
Figure 10:
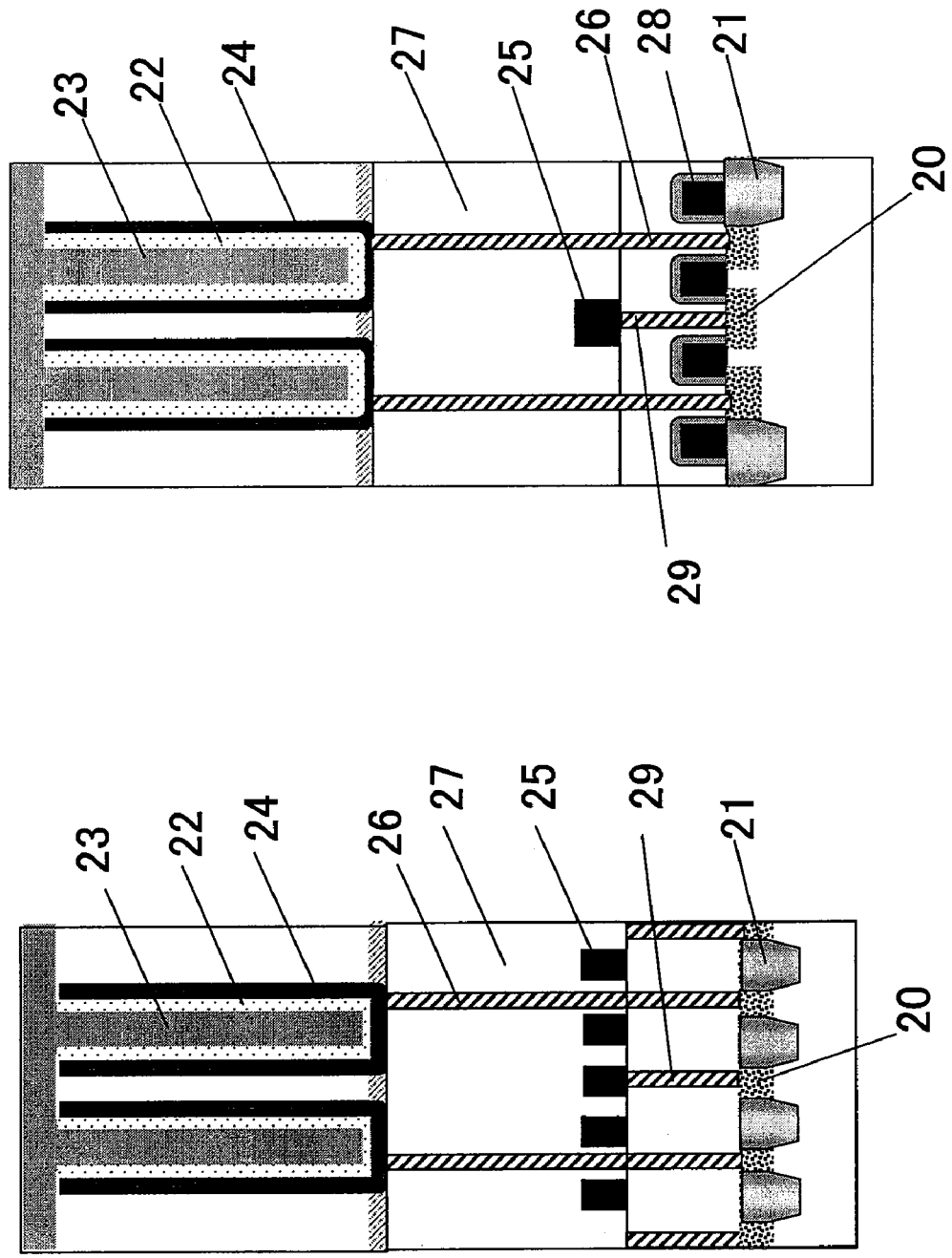
FIG. 10 is another schematic view illustrating part of the DRAM including the capacitor of the present invention.

FIGS. 9 and 10 are schematic views used to explain one example of a memory cell of a DRAM including the capacitor of the present invention. FIG. 9 schematically represents plan views of the memory cell of the DRAM taken from the upper surface thereof. For simplicity, the figure illustrates only the structure of a portion underlying the capacitor. FIGS. 10A and 10B are cross-sectional views respectively taken along the lines A-A and B-B of FIG. 9.

Portion 11 enclosed in an ellipse in FIG. 9 denotes the source/drain regions of a field-effect transistor regularly arranged in a memory cell region. In addition, bit contact plug 14 and capacitor contact plug 17 are electrically connected to a bit line and a capacitor, respectively.

In FIG. 10, reference numeral 28 denotes the gate electrode of a MOS-type transistor, and the gate electrode functions as a word line of the DRAM. Source/drain regions 20 respectively positioned on one and the other sides of gate electrode (word line) 28 are doped with an impurity. In addition, adjacent source/drain regions are electrically isolated from each other by isolating region 21 formed using an STI (Shallow Trench Isolation) method.

Capacitor contact plug 26 and bit contact plug 29 formed by burying an electrical conductor are formed on source/drain regions 20 on one and the other sides of gate electrode 28. More specifically, bit contact plug 29 is formed so as to penetrate through insulating layer 27 and reach the source/drain regions. Bit line 25 is electrically connected to this bit contact plug 29. In addition, capacitor contact plug 26 is formed so as to penetrate through insulating layer 27 to reach source/drain region 20. This capacitor contact plug 26 electrically connects the capacitor and source/drain region 20 to each other.

This capacitor is composed of lower electrode 24, dielectric film 22, and upper electrode 23 formed in this order. Dielectric film 22 is arranged so as to contact with lower electrode 24 and upper electrode 23 through the first surface of lower electrode 24 and through the first surface of upper electrode 23.

In FIG. 10, one gate electrode formed not on an isolating region but on a semiconductor region, source/drain regions respectively formed on one and the other sides of this gate electrode, bit contact plug 29 electrically connected to one source/drain region, capacitor contact plug 26 electrically connected to the other source/drain first region capacitor, and the like compose one memory cell. Accordingly, two memory cells are shown in FIG. 10B and bit contact plug 29 is shared between these two memory cells. Likewise, in FIG. 9, a portion composed of two capacitor contact plugs 17, one bit contact plug 14, two gate electrodes, and the like (portion 11 enclosed in an ellipse and a structure formed thereon) composes two memory cells.

By determining the state of charge retained in a capacitor formed in each memory cell through a MOS-type transistor, it is possible to read stored data. In addition, by retaining data in the capacitor formed in each memory cell through the MOS-type transistor, it is possible to write data to be stored.

If a memory cell of a DRAM is formed using the capacitor of the present invention, the electrical resistance of a capacitor electrode is kept low and the leakage current value of the capacitor is kept small. Thus, it is possible to easily form a high-performance DRAM superior in the data retention characteristic (refresh characteristic) of the memory cell. In addition to DRAMs, the capacitor of the present invention is applicable to other semiconductor devices, without any particular limitation, as long as the semiconductor devices use a capacitor.

It is apparent that the present invention is not limited to the above embodiments, but may be modified and changed without departing from the scope and spirit of the invention.

What is claimed is:

1. A capacitor electrode comprising a first surface and a second surface opposed to each other,
   wherein the capacitor electrode is composed of an $SrRuO_3$ film and contains a 10 atom % or less trivalent element in a region ranging from a position a predetermined distance away from the first surface in a thickness direction thereof up to the second surface side.

2. The capacitor electrode according to claim 1, wherein the trivalent element is La.

3. The capacitor electrode according to claim 1, wherein the predetermined distance is within the range of 0.5 to 2 nm.

4. A semiconductor device comprising a capacitor,
   wherein the capacitor includes:
   two capacitor electrodes according to claim 1; and
   a dielectric film formed between the two capacitor electrodes so as to contact with the first surface of each of the two capacitor electrodes.

5. The semiconductor device according to claim 4, wherein the relative permittivity of the dielectric film is 40 or greater.

6. The semiconductor device according to claim 4, wherein the dielectric film contains at least one type of oxide selected from the group consisting of $SrTiO_3$, $TiO_2$, $La_2O_3$, $Y_2O_3$, $HfO_2$, $ZrO_2$ and $(Ba,Sr)TiO_3$.

7. The semiconductor device according to claim 4, wherein data is stored depending on the state of charge retained in the capacitor.

8. A capacitor electrode, comprising:
   an $SrRuO_3$ film containing a 10 atom % or less trivalent element; and
   an $SrRuO_3$ film not containing a trivalent element.

9. The capacitor electrode according to claim 8, wherein the trivalent element is La.

10. The capacitor electrode according to claim 8, wherein the thickness of the $SrRuO_3$ film not containing the trivalent element is 0.5 to 2 nm.

11. A semiconductor device comprising a capacitor,
    wherein the capacitor includes:
    two capacitor electrodes according to claim 8; and
    a dielectric film formed between the two capacitor electrodes so as to contact with the $SrRuO_3$ film not containing the trivalent element of each of the two capacitor electrodes.

12. The semiconductor device according to claim 11, wherein the relative permittivity of the dielectric film is 40 or greater.

13. The semiconductor device according to claim 11, wherein the dielectric film contains at least one type of oxide selected from the group consisting of $SrTiO_3$, $TiO_2$, $La_2O_3$, $Y_2O_3$, $HfO_2$, $ZrO_2$ and $(Ba,Sr)TiO_3$.

14. The semiconductor device according to claim 11, wherein data is stored depending on the state of charge retained in the capacitor.

* * * * *